United States Patent
Kamigama et al.

(10) Patent No.: US 6,851,177 B2
(45) Date of Patent: Feb. 8, 2005

(54) MANUFACTURING METHOD OF HEAD ARM ASSEMBLY

(75) Inventors: Takehiro Kamigama, Tokyo (JP); Masashi Shiraishi, Tokyo (JP)

(73) Assignee: TDK Corporation, Tokyo (JP)

( * ) Notice: Subject to any disclaimer, the term of this patent is extended or adjusted under 35 U.S.C. 154(b) by 172 days.

(21) Appl. No.: 09/953,172

(22) Filed: Sep. 17, 2001

(65) Prior Publication Data

US 2002/0038506 A1 Apr. 4, 2002

(30) Foreign Application Priority Data

Sep. 19, 2000 (JP) ........................................ 2000-283283

(51) Int. Cl.$^7$ ........................... G11B 5/127; H04R 31/00
(52) U.S. Cl. ................ 29/603.04; 29/592.1; 29/603.01; 29/603.06; 29/861; 29/867; 360/234.5; 360/245.8
(58) Field of Search ........................... 29/592.1, 603.01, 29/603.04, 603.06, 861, 867, 602.1, 603.05, 603.09, 603.1; 360/234.5, 245.8, 234.2–234.8

(56) References Cited

U.S. PATENT DOCUMENTS

| | | | | |
|---|---|---|---|---|
| 5,631,789 A | * | 5/1997 | Dion et al. | 360/266.1 |
| 5,862,019 A | * | 1/1999 | Larson | 360/265.8 |
| 5,924,187 A | * | 7/1999 | Matz | 29/603.03 |
| 6,252,743 B1 | * | 6/2001 | Bozorgi | 630/244.1 |
| 6,459,548 B1 | * | 10/2002 | Shiraishi et al. | 360/245.9 |

FOREIGN PATENT DOCUMENTS

JP 04232608 A * 8/1992 ........... G11B/5/455

OTHER PUBLICATIONS

"Piezo–based milliactuator on a partially etched suspension", Arya, S.; Yau–Shing Lee; Wei–Min Lu; Staudenmann, M.; Hatchet M.; Magnetics, IEEE Transactions on, vol. 37 Issue: 2, Mar 2001 Page(s): 934–939.*

* cited by examiner

Primary Examiner—A. Dexter Tugbang
Assistant Examiner—Paul Kim
(74) Attorney, Agent, or Firm—Burns, Doane, Swecker & Mathis, L.L.P.

(57) ABSTRACT

A manufacturing method of an HAA includes a step of fixing a first lead conductor member onto a suspension, a step of attaching a second lead conductor member to at least one actuator arm, a step of fixing the suspension onto the at least one actuator arm, a step of electrically connecting the first lead conductor member fixed on the suspension with the second lead conductor member attached on the at least one actuator arm, a step of, thereafter, fixing a head slider provided with at least one head element onto the suspension, and a step of electrically connecting the at least one head element with the first lead conductor member.

8 Claims, 4 Drawing Sheets

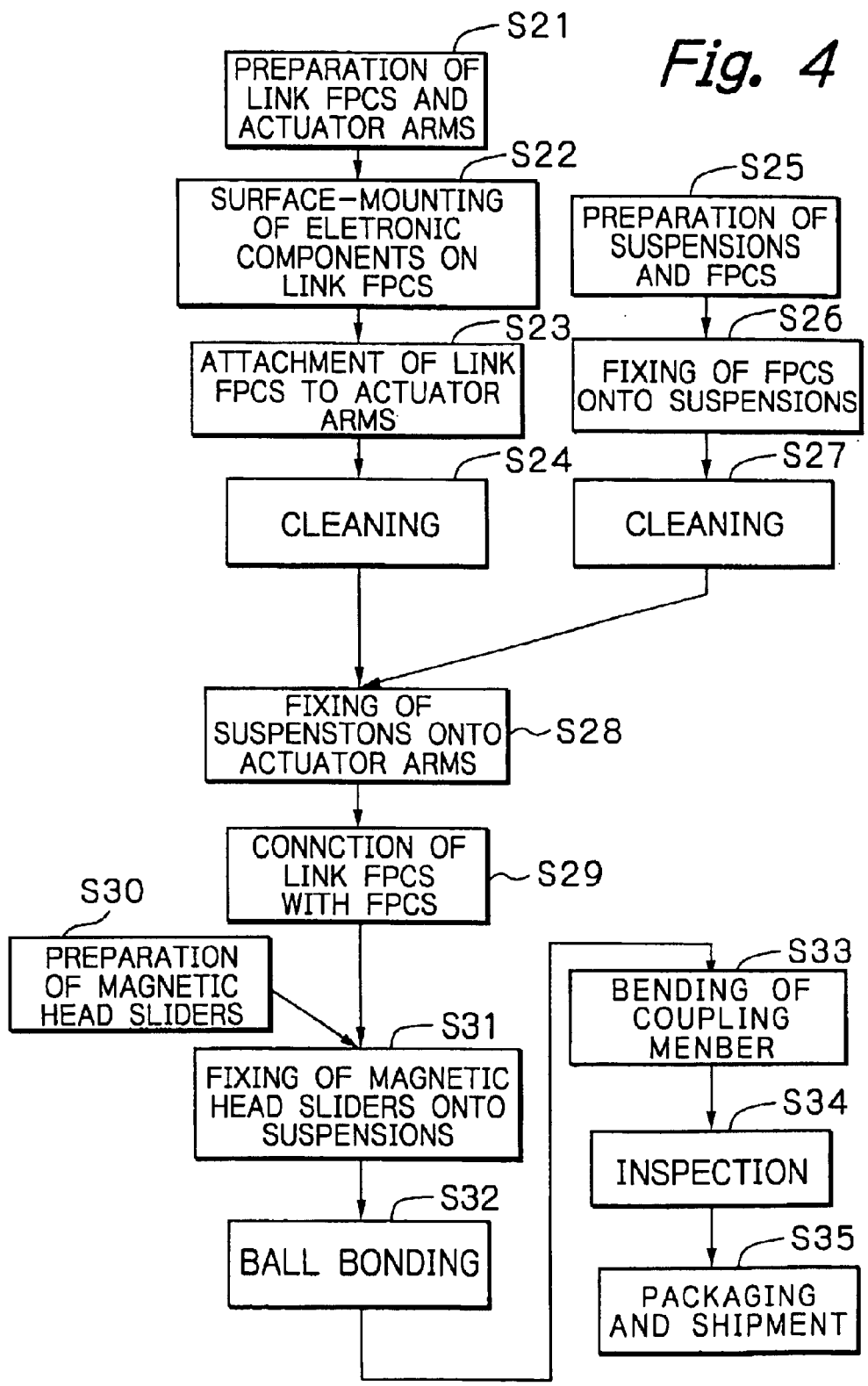

MANUFACTURING METHOD OF HEAD ARM ASSEMBLY

FIELD OF THE INVENTION

The present invention relates to a manufacturing method of a head arm assembly (HAA) configured by assembling at least one head gimbal assembly (HGA) and at least one movable arm or actuator arm for controlling a position of the at least one HGA.

DESCRIPTION OF THE RELATED ART

The HGA is mainly configured by a head slider provided with at least one head element such as a thin-film magnetic head element or an optical head element, a suspension for supporting the head slider and a lead conductor member for the head element. The HAA is in general configured by attaching a plurality of the HGAs to actuator arms provided with a voice coil motor (VCM) or an actuator, and by making electrical connection of the lead conductor member of the HGAs.

Following is a conventional manufacturing method of the HAA. First, a magnetic head slider is fixed to a suspension on which a lead conductor member such as a flexible print circuit (FPC) is fixed, and then terminal electrodes formed on the magnetic head slider are electrically connected with head connection pads of the FPC to provide the HGA. Then, a plurality of the HGAs are respectively fixed by swaging to an E-block consisting of a plurality of the actuator arms, and the FPCs on the suspensions and a link FPC are electrically connected. The fabricated HAA will then receive various electrical and mechanical inspections.

According to the aforementioned conventional manufacturing method of the HAA, each HGA is fabricated by fixing the magnetic head slider with the thin-film magnetic head element onto the suspension, and the HAA is completed by executing various processes including assembling of the HGAs.

Thus, during the assembling processes from the fixing of the magnetic head slider to the completing of the HAA, the thin-film magnetic head element on the slider may be sometimes destructed due to electric static discharge (ESD). In particular, when the thin-film magnetic head element has a magnetoresistive effect (MR) film, the element will be easily subjected to the ESD destruction.

In order to prevent the thin-film magnetic head element from such ESD destruction, proposed were various protection techniques such as a technique for temporally making a shunt circuit between terminals of each head element or a technique for inserting a Zener diode between terminals of each head element. However, these proposed protection techniques need an additional component and/or an additional process.

SUMMARY OF THE INVENTION

It is therefore an object of the present invention to provide a manufacturing method of an HAA, whereby ESD destruction can be effectively prevented only by simply modifying a manufacturing process without adding a component or a new process.

According to the present invention, a manufacturing method of an HAA includes a step of fixing a first lead conductor member onto a suspension, a step of attaching a second lead conductor member to at least one actuator arm, a step of fixing the suspension onto the at least one actuator arm, a step of electrically connecting the first lead conductor member fixed on the suspension with the second lead conductor member attached on the at least one actuator arm, a step of, thereafter, fixing a head slider provided with at least one head element onto the suspension, and a step of electrically connecting the at least one head element with the first lead conductor member.

A head slider with at least one head element is mounted on the HAA that is completed except for the fixing of and the electrical connection of this head slider, and then the head element is electrically connected with the first lead conductor member. Thus, the number of processes performed after the mounting of the head element according to the present invention becomes smaller than that of the manufacturing method of the HAA according to the conventional art, and therefore effective protection of ESD destruction of the head element can be expected. As a result, yield of the HAA can be improved and also its manufacturing cost can be reduced. It is an advantage of the present invention that, after the head element is electrically connected with the second lead conductor member on the actuator arm, protection against the ESD destruction can be very easily executed by shunt-circuiting this second lead conductor member.

It is preferred that the at least one actuator arm includes an individual single actuator arm.

It is also preferred that the at least one actuator arm includes a pair of actuator arms coupled with each other. In this case, preferably, the method further includes a step of bending the HAA so that the pair of actuator arms are faced with each other. This step is executed after the electrically connecting step of the at least one head element with the first lead conductor member. Since the head slider is mounted and the electrical connection of the head element is executed before the bending step, the mounting process of the head slider and also the electrical connection process can be extremely easily executed.

It is preferred that the attaching step includes attaching a coupling member to the pair of actuator arms so as to couple the pair of actuator arms with each other. Preferably, the bending step includes bending the coupling member so that the pair of actuator arms are faced with each other.

It is also preferred that the electrically connecting step of the at least one head element with the first lead conductor member includes ball-bonding the at least one head element to the first lead conductor member.

It is further preferred that the method further includes a step of mounting at least one electronic component on the second lead conductor member. This mounting step is executed before the attaching step of the second lead conductor member to the at least one actuator arm. In this case, the at least one electronic component may be an IC chip for the at least one head element.

It is preferred that the method further includes a step of inspecting the HGA just after the electrically connecting step of the at least one head element with the first lead conductor member is executed. During the inspection, since the head element is electrically connected to the inspection instrument, ESD destruction of the head element can be prevented.

It is preferred that the head element is a thin-film magnetic head element or an optical head element.

Further objects and advantages of the present invention will be apparent from the following description of the preferred embodiments of the invention as illustrated in the accompanying drawings.

BRIEF DESCRIPTION OF THE DRAWINGS

FIG. 4 shows a flow chart illustrating a part of a manufacturing process of the HAA shown in FIG. 3 as another embodiment according to the present invention.

DESCRIPTION OF THE PREFERRED EMBODIMENTS

Figure 1:
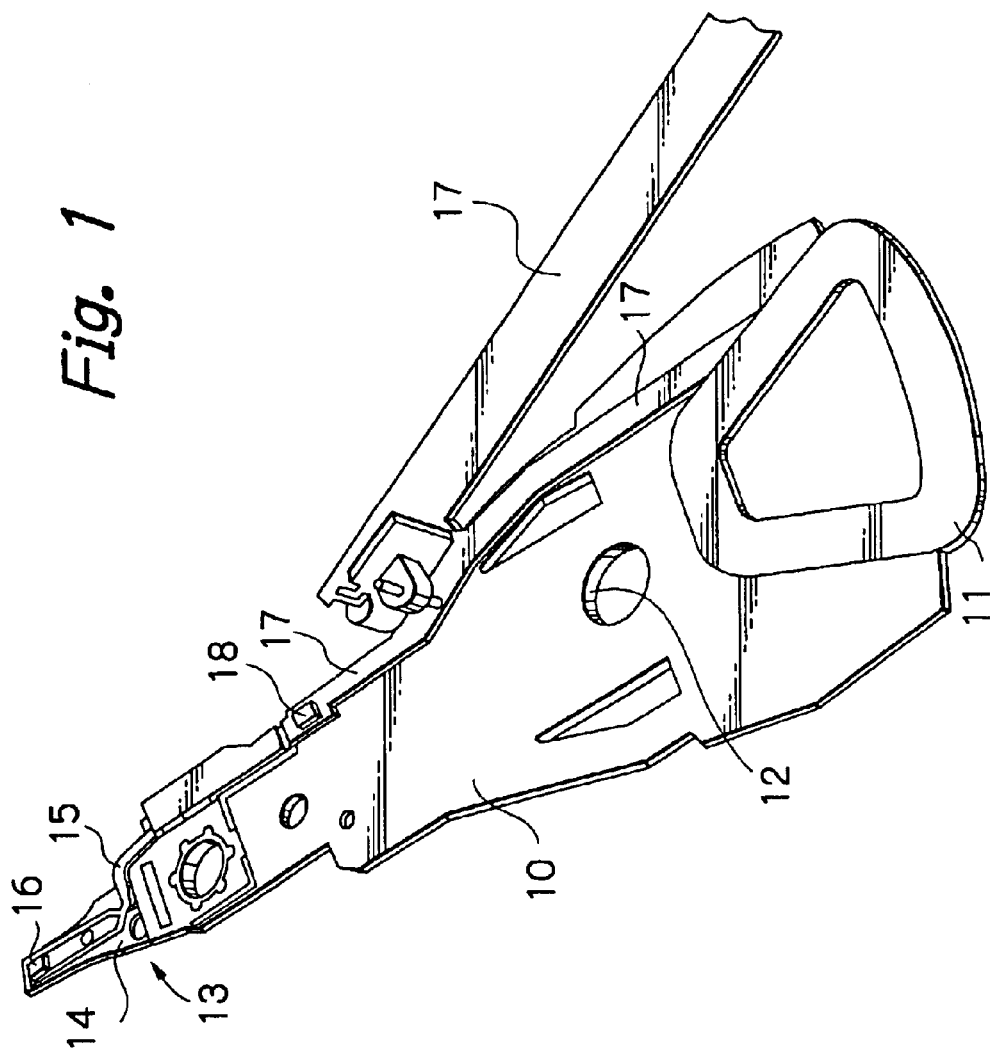
FIG. 1 shows an oblique view schematically illustrating one example of a structure of an HAA manufactured according to the present invention.

In FIG. 1 illustrating one structure example of an HAA manufactured according to the present invention, reference numeral 10 Denotes an individual single movable arm or actuator arm, and 11 denotes a coil of a VCM, formed at a rear end section of the actuator arm 10. The actuator arm 10 is configured to swing around an axis hole 12 by the VCM. An HGA 13 is fixed onto a top end section of the actuator arm 10.

The HGA 13 is mainly configured by a suspension 14, a first lead conductor member made of a FPC 15 fixed onto the suspension 14, and a magnetic head slider 16 fixed onto a top end section of the suspension 14. Terminal electrodes of this slider 16 are ball-bonded with head connection pads formed at one end of the FPC 15, respectively. At least one thin-film magnetic head element such as a MR head element for example is formed on the magnetic head slider 16.

To the actuator arm 10, a second lead conductor member made of a link FPC 17 is attached. One ends of the link FPC 17 are electrically connected to the other end of the FPC 15 and to the coil 11 of the VCM. Although it is not shown, external connection pads used for electrically connecting with an external circuit are provided at the other end section of the link FPC 17. An IC chip 18 including an amplifier for the thin-film magnetic head element is mounted at a midpoint of the link FPC 17.

Figure 2:
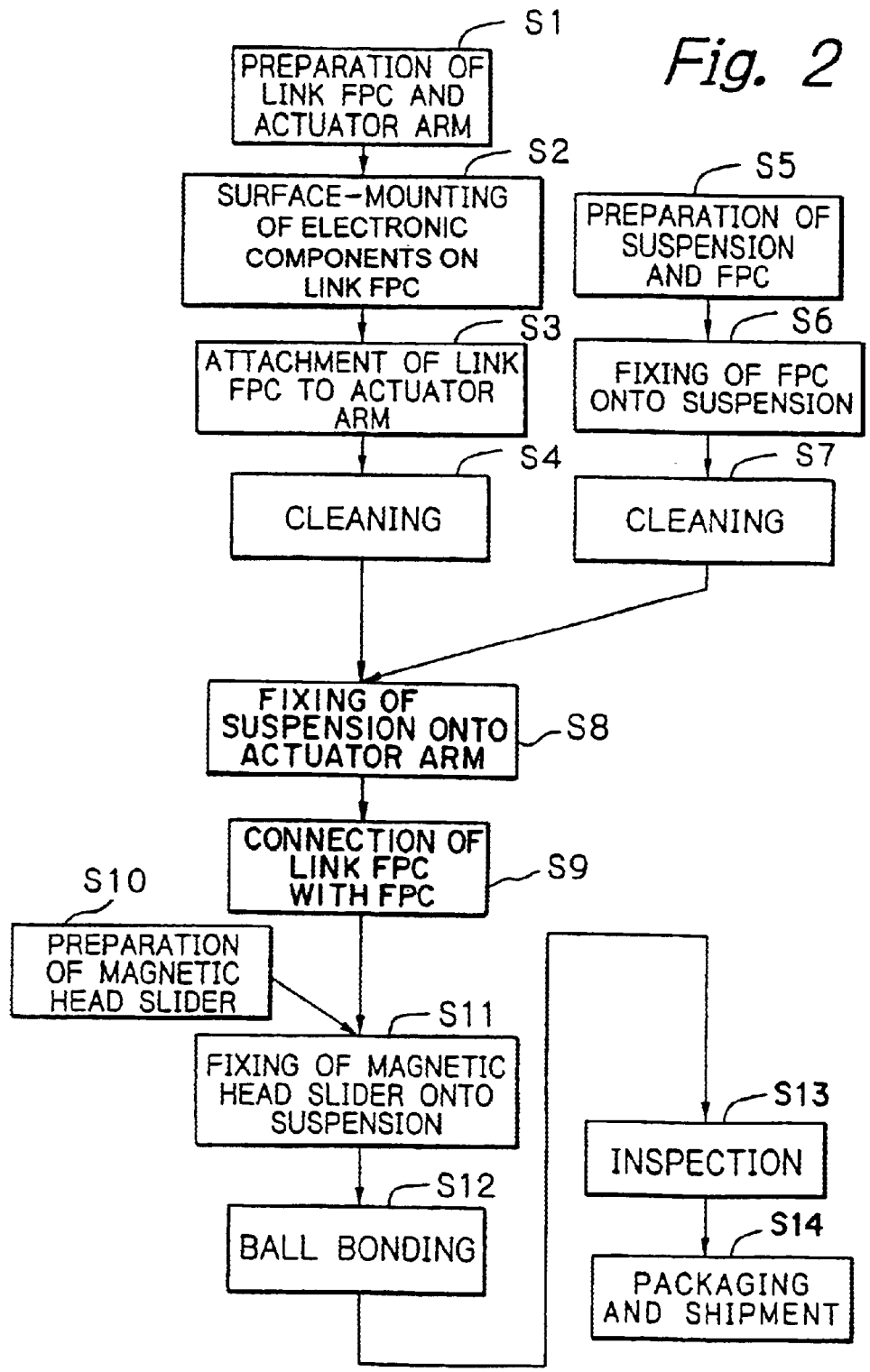
FIG. 2 shows a flow chart illustrating a part of a manufacturing process of the HAA shown in FIG. 1 as a preferred embodiment according to the present invention.

FIG. 2 illustrates a part of a manufacturing process of the HAA shown in FIG. 1 as a preferred embodiment according to the present invention. With reference to this figure, an assembling process of the HAA will be described hereinafter.

First, the link FPC 17 and the actuator arm 10 are prepared (step S1). If necessary, at least one electronic component such as the IC chip 18 and/or a resistor is surface-mounted at a midpoint of the link FPC 17 (step S2).

Then, the link FPC 17 with the surface-mounted electronic component is attached to the actuator arm 10 (step S3), and a cleaning of the actuator arm 10 with the attached link FPC 17 is executed using water for example (step S4).

On the other hand, the suspension 14 having a required structure and the FPC 15 are prepared (step S5), and then the FPC 15 is fixed onto the suspension 14 (step S6). Then, a cleaning of the suspension 14 with the fixed FPC 15 is executed using water for example (step S7).

Thereafter, the suspension 14 with the fixed FPC 15 is fixed by swaging onto the actuator arm 10 with the attached link FPC 17 (step S8), and the FPC 15 is electrically connected to the link FPC 17 (step S9).

On the other hand, the magnetic head slider 16 with at least one thin-film magnetic head element such as a MR head element for example is prepared (step S10), and then the magnetic head slider 16 is fixed onto the suspension 14 (step S11). Then, the terminal electrodes for the thin-film magnetic head element, formed on the magnetic head slider 16 are ball-bonded by gold balls or solder balls to the head connection pads formed on the FPC 15, respectively (step S12).

Thereafter, thus assembled HAA is set to an inspection instrument such as a dynamic performance (DP) tester without delay, and electrical and mechanical performances of the HAA are checked (step S13). If necessary, a visual inspection of the HAA may be executed.

The HAA passed in the inspection is then packaged and approved for shipment (step S14).

As aforementioned, according to this embodiment, the magnetic head slider 16 is mounted on the HAA that is completed except for the mounting of and the electrical connection of this slider 16, and then the terminal electrodes for the thin-film magnetic head element, formed on the slider 16 are ball-bonded to the head connection pads of the FPC 15. Thus, the number of processes performed after the mounting of the thin-film magnetic head element according to this embodiment becomes smaller than that of the manufacturing method of the HAA according to the conventional art, and therefore effective protection of ESD destruction of the thin-film magnetic head element can be expected. As a result, yield of the HAA can be improved and also its manufacturing cost can be reduced. Furthermore, ESD destruction of the thin-film magnetic head element can be effectively prevented only by simply modifying the manufacturing process without adding a component or a new process.

Since the inspection is carried out just after the mounting of the magnetic head slider 16, and also, during the inspection, the thin-film magnetic head element is electrically connected to the inspection instrument, ESD destruction of the thin-film magnetic head element can be effectively prevented from this point.

It should be noted that, after the thin-film magnetic head element is electrically connected with the link FPC 17, for example during the packaging of the HAA, protection against the ESD destruction can be very easily executed by shunt-circuiting the external connection pads of the link FPC 17.

Figure 3:
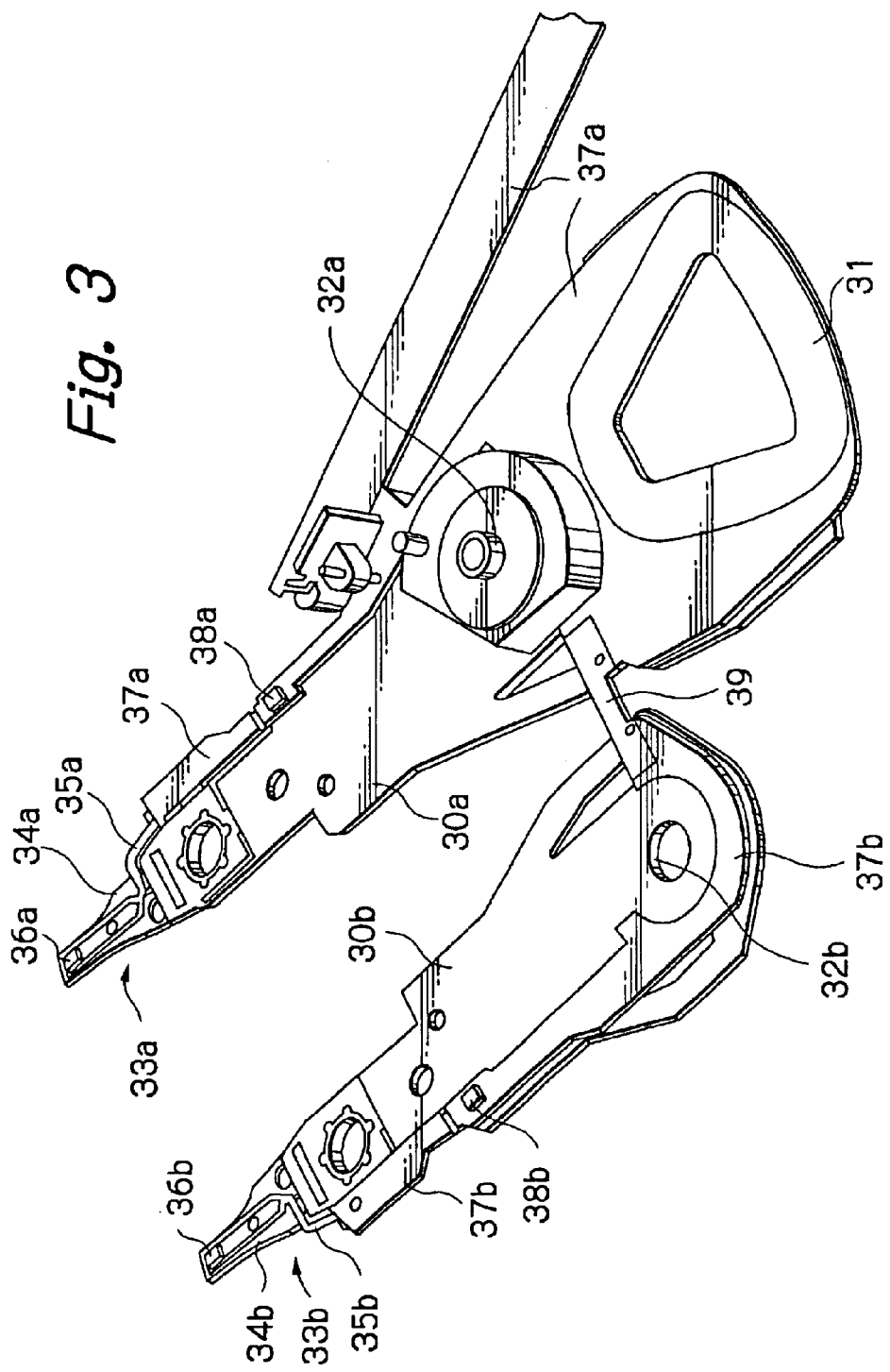
FIG. 3 shows an oblique view schematically illustrating another example of a structure of an HAA manufactured according to the present invention.

FIG. 3 illustrates another structure example of an HAA manufactured according to the present invention. In the figure, reference numerals 30a and 30b denote a pair of movable arms or actuator arms coupled by a flexible coupling member 39 which doubles as a lead conductor member, so that, by bending the coupling member 39, the arms 30a and 30b are faced with each other, and 31 denotes a coil of a VCM, formed at a rear end section of the actuator arm 30a. The pair of actuator arms 30a and 30b are configured after they are fixed with each other by bending the coupling member 39 and fitting an axis 32a into an axis hole 32b, to swing around the aliened axis 32a and axis hole 32b by the VCM. HGAs 33a and 33b are fixed onto top end sections of the actuator arms 30a and 30b, respectively.

The HGAs 33a and 33b are mainly configured by suspensions 34a and 34b, first lead conductor members made of FPCs 35a and 35b fixed onto the respective suspensions 34a and 34b, and magnetic head sliders 36a and 36b fixed onto top end sections of the respective suspensions 34a and 34b. Terminal electrodes of these sliders 36a and 36b are ball-bonded with head connection pads formed at one ends of the respective FPCs 35a and 35b, respectively. At least one thin-film magnetic head element such as a MR head element for example is formed on each of the magnetic head sliders 36a and 36b.

To the actuator arms 30a and 30b, second lead conductor members made of link FPCs 37a and 37b are attached, respectively. One end of the link FPC 37b is electrically connected to the other end of the FPC 15b. One ends of the link FPC 37a are connected to the other end of the FPC 15a, to the other end of the link FPC 37b via the coupling member 39, and to the coil 31 of the VCM. Although it is not shown, external connection pads used for electrically connecting with an external circuit are provided at the other end section of the link FPC 37a. IC chips 38a and 38b respectively including amplifiers for the thin-film magnetic head elements are mounted at midpoints of the respective link FPCs 37a and 37b.

FIG. 4 illustrates a part of a manufacturing process of the HAA shown in FIG. 3 as another embodiment according to the present invention. With reference to this figure, an assembling process of the HAA will be described hereinafter.

First, the link FPCs 37a and 37b and the pair of actuator arms 30a and 30b are prepared (step S21). If necessary, electronic components such as the IC chips 38a and 38b and/or resistors are surface-mounted at midpoints of the respective link FPCs 37a and 37b (step S22).

Then, the link FPCs 37a and 37b with the surface-mounted electronic components and the coupling member 39 are attached to the respective actuator arms 30a and 30b (step S23), and then cleanings of the actuator arms 30a and 30b with the attached link FPCs 37a and 37b are executed using water for example (step S24).

On the other hand, the suspensions 34a and 34b having a required structure and also the FPCs 35a and 35b are prepared (step S25), and then the FPCs 35a and 35b are fixed onto the respective suspension 34a and 34b (step S26). Then, cleanings of the suspensions 34a and 34b with the fixed FPCs 35a and 35b are executed using water for example (step S27).

Thereafter, the suspensions 34a and 34b with the fixed FPCs 35a and 35b are fixed, by swaging, onto the respective actuator arms 30a and 30b with the attached link FPCs 37a and 37b (step S28), and then the FPCs 35a and 35b are electrically connected to the link FPCs 37a and 37b, respectively (step S29).

On the other hand, the magnetic head sliders 36a and 36b each having at least one thin-film magnetic head element such as a MR head element for example are prepared (step S30), and then these magnetic head sliders 36a and 36b are fixed onto the respective suspensions 34a and 34b (step S31). Then, the terminal electrodes for the thin-film magnetic head elements, formed on the magnetic head sliders 36a and 36b are ball-bonded by gold balls or solder balls to the head connection pads formed on the respective FPCs 35a and 35b, respectively (step S32).

Then, the coupling member 39 is bent so that the magnetic head sliders 36a and 36b on the respective actuator arms 30a and 30b are faced with each other, and then the actuator arms 30a and 30b are fixed with each other by fitting the axis 32a into the axis hole 32b (step S33).

Thereafter, thus assembled HAA is set to an inspection instrument such as a DP tester without delay, and electrical and mechanical performances of the HAA are checked (step S34). If necessary, a visual inspection of the HAA may be executed.

The HAA passed in the inspection is then packaged and approved for shipment (step S35).

As aforementioned, according to this embodiment, the magnetic head sliders 36a and 36b are fixed to the HAAs that are completed except for the attachment of and the electrical connection of these sliders 36a and 36b, and then the terminal electrodes of the sliders 36a and 36b are ball-bonded to the head connection pads of the FPCs 35a and 35b. Thus, the number of processes performed after the mounting of the magnetic head sliders 36a and 36b according to this embodiment becomes smaller than that of the manufacturing method of the HAA according to the conventional art, and therefore effective protection of ESD destruction of the thin-film magnetic head elements can be expected. As a result, yield of the HAA can be improved and also its manufacturing cost can be reduced. Furthermore, ESD destruction of the thin-film magnetic head elements can be effectively prevented only by simply modifying the manufacturing process without adding a component or a new process.

Particularly, according to this embodiment, since the coupling member 39 is bent so that the pair of the actuator arms 30a and 30b are faced with each other after the magnetic head sliders 36a and 36b are mounted and their terminal electrodes are ball-bonded, the mounting process of the magnetic head sliders 36a and 36b and also the ball-bonding process can be extremely easily executed.

Since the inspection is carried out just after the mounting of the magnetic head sliders 36a and 36b and the bending, and also, during the inspection, the thin-film magnetic head elements are electrically connected to the inspection instrument, ESD destruction of the thin-film magnetic head elements can be effectively prevented from this point.

It should be noted that, after the thin-film magnetic head elements are electrically connected with the respective link FPCs 37a and 37b, for example during the packaging of the HAA, protection against the ESD destruction can be very easily executed by shunt-circuiting the external connection pads of the link FPC 37a.

In the aforementioned embodiments, the manufacturing methods of the HAA having the magnetic head slider with the thin-film magnetic head element are described. However, it is apparent that the present invention can be applied to a manufacturing method of an HAA with a head element such as an optical head element other than the thin-film magnetic head element.

Many widely different embodiments of the present invention may be constructed without departing from the spirit and scope of the present invention. It should be understood that the present invention is not limited to the specific embodiments described in the specification, except as defined in the appended claims.

What is claimed is:

1. A manufacturing method of a head assembly, comprising the steps of:

fixing a first lead conductor member onto a suspension, and attaching a second lead conductor member to at least one actuator arm, wherein said at least one actuator arm comprises a pair of actuator arms coupled with each other;

after performing said fixing and attaching step, fixing said suspension with the fixed first lead conductor onto said at least one actuator arm with the attached lead conductor;

electrically connecting said first lead conductor member fixed on said suspension with said second lead conductor member attached on said at least one actuator arm;

thereafter, fixing a head slider provided with at least one head element onto said suspension;

electrically connecting said at least one head element with said first lead conductor member; and bending said head arm assembly so that said pair of actuator arms are faced with each other, said bending step being executed after said electrically connecting step of said at least one head element with said first lead conductor member.

2. The manufacturing method as claimed in claim 1, wherein said attaching step comprises attaching a coupling member to said pair of actuator arms so as to couple said pair of actuator arms with each other.

3. The manufacturing method as claimed in claim 2, wherein said bending step comprises bending said coupling member so that said pair of actuator arms are faced with each other.

4. The manufacturing method as claimed in claim 1, wherein said electrically connecting step of said at least one head element with said first lead conductor member comprises ball-bonding said at least one head element to said first lead conductor member.

5. The manufacturing method as claimed in claim 1, wherein said method further comprises a step of mounting at least one electronic component on said second lead conductor member, said mounting step being executed before said attaching step of said second lead conductor member to said at least one actuator arm.

6. The manufacturing method as claimed in claim 5, wherein said at least one electronic component comprises an IC chip for said at least one head element.

7. The manufacturing method as claimed in claim 1, wherein said method further comprises a step of inspecting said head arm assembly just after said electrically connecting step of said at least one head element with said first lead conductor member is executed.

8. The manufacturing method as claimed in claim 1, wherein said head element is a thin-film magnetic head element.

* * * * *